United States Patent
Suzuki

[19]

[11] Patent Number: 5,989,474
[45] Date of Patent: Nov. 23, 1999

[54] METHOD FOR FABRICATING RESIN-SEALED SEMICONDUCTOR DEVICE USING LEADFRAME PROVIDED WITH RESIN DAM BAR

[75] Inventor: Yasuhiro Suzuki, Tokyo, Japan

[73] Assignee: NEC Corporation, Tokyo, Japan

[21] Appl. No.: 08/509,632

[22] Filed: Jul. 31, 1995

[30] Foreign Application Priority Data

Jul. 29, 1994 [JP] Japan ................................. 6-177887

[51] Int. Cl.⁶ .......................... B29C 37/02; B29C 70/72; B29C 70/76
[52] U.S. Cl. ...................... 264/400; 264/139; 264/272.17
[58] Field of Search .................. 264/272.11, 272.15, 264/272.17, 254, 255, 250, 400, 276, 132, 139

[56] References Cited

U.S. PATENT DOCUMENTS

| | | | |
|---|---|---|---|
| 4,504,427 | 3/1985 | Moyer | 264/272.17 |
| 4,592,131 | 6/1986 | Deie | 264/276 |
| 4,919,857 | 4/1990 | Hojyo | 264/272.17 |
| 5,232,651 | 8/1993 | Okuno et al. | 264/272.15 |
| 5,258,331 | 11/1993 | Masumoto et al. | 264/272.17 |
| 5,446,080 | 8/1995 | Shima et al. | 427/120 |

FOREIGN PATENT DOCUMENTS

| | | |
|---|---|---|
| 1-241850 | 9/1989 | Japan . |
| 1-253927 | 10/1989 | Japan . |
| 3-106063 | 5/1991 | Japan . |
| 3-248451 | 11/1991 | Japan . |
| 4-206560 | 7/1992 | Japan . |
| 4-369259 | 12/1992 | Japan . |

Primary Examiner—Angela Ortiz
Attorney, Agent, or Firm—Young & Thompson

[57] ABSTRACT

An insulating-resin dam bar made of ultraviolet-curing epoxy resin with a low adhesiveness to a leadframe is applied onto an outer lead by screen printing. After the leadframe is sealed with resin, the insulating-resin dam bar is removed by wet honing such as water-jet honing or laser irradiation. Thereafter, a resin-sealed semiconductor device is finished through normal fabrication processes.

5 Claims, 6 Drawing Sheets

METHOD FOR FABRICATING RESIN-SEALED SEMICONDUCTOR DEVICE USING LEADFRAME PROVIDED WITH RESIN DAM BAR

BACKGROUND OF THE INVENTION

The present invention relates to a method for fabricating a semiconductor device, particularly to a method for fabricating a resin-sealed semiconductor device using a leadframe provided with a dam bar made of an electrically insulating material.

An existing leadframe used for a resin-sealed semiconductor device is provided with an island to which a semiconductor device is secured, inner leads each of which is connected to a pad of the semiconductor device by a bonding wire, outer leads formed integrally with the inner leads, a frame to which the other ends of the outer leads are connected in common, and a feed hole for moving the leadframe. In this case, the inner and outer leads are integrated to form a lead and a plurality of leads are almost-radially and separately arranged on the circumference of the island. The inner leads are sealed with resin and inner ends of the inner leads are connected with the pad of the semiconductor device to form open ends. Metal of the leadframe is removed between a plurality of arranged leads, between the island and a lead, and between a suspended lead of the island and a lead. The metal is removed by means of punching by dies or chemical etching. Some leadframes have more than 100 leads. Therefore, while a semiconductor device is secured to an island and the semiconductor device and inner leads are sealed with resin, a lead may be deformed or deviated from a predetermined position. To prevent the above trouble, a dam bar is used to connect the leads so that they are not separated from each other. The dam bar is formed by leaving a die sheet integrated with a lead or the like.

A resin-sealed semiconductor device has been provided with the dam bar connecting outer leads to each other in order to keep resin when the semiconductor device is sealed with the resin and electrically insulate outer leads from each other by cutting the dam bar with a cutting die after the device is sealed with the resin. Under the above condition, because the lead width has been decreased in recent years due to decrease of the pitch between outer leads, it has been necessary to decrease the width of a cutting punch for cutting the dam bar in accordance with the decrease of the lead width. However, when the cutting-punch width is decreased, the mechanical strength of the punch is also decreased. Therefore, as the outer-lead pitch decreases, the durability and abrasion resistance of a cutting die (punch) are greatly decreased and thereby, the punching system cannot be used when the outer-lead pitch is 0.4 or 0.3 mm.

Thus, to disuse the cutting process using the punching system, a dam bar is proposed which is made by fixing an insulating resin without forming a metallic dam bar. A resin-sealed semiconductor device using this type of the insulating-resin dam bar is roughly classified into two types in view of its configuration. The first type is a type in which dam bars are kept up to an end product without being removed even after resin sealing. In the case of a leadframe of the first type, an insulating-resin dam bar is applied onto or nearby a boundary line between an inner lead and an outer lead formed on the leadframe, that is, a mold edge line serving as a mold edge after resin sealing. Thereafter, the leadframe is sealed with resin by means of resin sealing while bonding the insulating-resin dam bar. The insulating-resin dam bar uses a polyimide-based resin or a thermosetting resin. To apply a resin to a leadframe, the dispensing method is frequently used which applies resin while dropping it. After the leadframe is sealed with resin, it is passed through normal fabrication processes to form outer leads with insulating-resin dam bars left on it and formed into an end product.

The second type is a type in which an insulating-resin dam bar is removed after resin sealing by dissolving it with chemicals including solvents. In the case of a leadframe of the second type, an insulating-resin dam bar is applied onto an outer lead of the leadframe, that is, at a position slightly outside of a mold edge line by the dispensing method or the like. Then, the leadframe is sealed with resin by means of resin sealing. In the case of this type, sealing resin protrudes between the mold edge line and the insulating-resin dam bar, that is, dam resin remains between them because the insulating-resin dam bar is set outside the mold edge line so that it is easily removed later. Therefore, it is general to decrease the distance between the mold edge line and the insulating-resin dam bar in order to decrease the amount of the dam resin. After the leadframe is sealed with resin, the insulating-resin dam bar is removed by a solvent for dissolving only the insulating-resin dam bar and thereafter passed through normal fabrication process and formed into an end product. Or, the dam bar is mechanically removed.

Therefore, by using insulating-resin dam bars, the existing dam-bar cutting process is disused, problems of the durability and abrasion of a dam-bar cutting die are solved, and a resin-sealed semiconductor device is realized which can correspond to fine outer-lead pitches of 0.4 and 0.3 mm. In the case of the first type of keeping insulating-resin dam bars up to an end product, which is one of the existing resin-sealed semiconductor devices using insulating-resin dam bars, however, it is necessary to minimize the amount of insulating-resin dam bar protruded from a mold edge line. If the protruded amount of insulating-resin dam bar is too much, this causes a trouble in later lead bending because a dam bar is caught by a bent portion of a lead when forming the lead. Therefore, a problem occurs that a predetermined lead shape or dimension cannot be obtained. Moreover, in the case of this type, because dam bars are kept up to an end product, the material of an insulating-resin dam bar requires a high reliability equivalent to that of a sealing resin. Therefore, the resin cost may increase for development and practical use of the insulating-resin dam bar. In the case of the second type, that is, the type of removing dam bars after resin sealing, chemicals including solvents are used to remove insulating-resin dam bars and these solvents are deleterious substances in general. Therefore, they cause the problem of dangerousness when an operator handles them and the problem of environmental pollution. Moreover, because solvents contact a semiconductor device, the reliability of a sealing resin may be deteriorated. Furthermore, when mechanically removing a dam bar, the airtightness of a sealing resin may be deteriorated. Furthermore, in any case, a trouble such as coating irregularity or thin spot easily occurs because an insulating-resin dam bar is coated by a dropping method such as the dispensing method which is performed by dropping resin onto a lead and moreover, a problem occurs that the coating width of an insulating-resin dam bar easily becomes inaccurate or the positional accuracy of it is easily degraded.

SUMMARY OF THE INVENTION

Therefore, it is an object of the present invention to provide a method for fabricating a semiconductor device making it possible to selectively accurately form an insulating-resin dam bar.

It is another object of the present invention to provide a method for fabricating a semiconductor device making it possible to remove an insulating-resin dam bar without deteriorating the airtightness of a sealing resin.

The method of the present invention for fabricating a semiconductor device comprises the steps of preparing a leadframe formed by arranging a plurality of leads in which front ends of inner leads serve as open ends and the other ends of outer leads following the inner leads are connected to a common frame member at selected intervals and forming dam bars by connecting one ends of the outer leads by an insulating material; wherein the step of forming a liquid insulating material by the screen printing method and thereafter forming dam bars by solidifying the insulating material, the steps of sealing the inner leads with an insulating resin, and the step of removing the dam bars are included.

It is preferable to use ultraviolet-curing epoxy resin as the insulating material in the step of forming dam bars. Moreover, it is particularly characterized that dam bars are pressed by a die used to seal the inner leads with the insulating material to crack the dam bars before the step of removing the dam bars.

Furthermore, it is characterized that the insulating material is removed by means of wet honing in the step of removing the dam bars.

According to the present invention, it is possible to remove insulating-resin dam bars without using chemicals such as solvents and avoid the problems of safety and environmental pollution because the insulating-resin dam bars are removed after resin sealing and thereby the insulating-resin dam bars do not affect lead bending which is the subsequent step. Moreover, because insulating-resin dam bars are removed in the middle process unlike the type of keeping insulating-resin dam bars up to an end product, a high reliability of resin is unnecessary and there is no problem on leak which may be caused by keeping dam bars. Thereby, the number of characteristics requested for an insulating-resin dam bar decreases and unnecessary cost is not increased for development. Furthermore, the present invention makes it possible to stably apply insulating-resin dam bars at a high positional accuracy and thereby fabricate a higher-quality resin-sealed semiconductor device because the screen printing method is used to apply the insulating-resin dam bars instead of the existing dispensing method.

BRIEF DESCRIPTION OF THE DRAWINGS

The above and other objects, features, and advantages of the present invention will be more apparent from the following description taken in conjunction with the accompanying drawings, in which.

DETAILED DESCRIPTION OF THE PREFERRED EMBODIMENTS

Before describing embodiments of the present invention, a conventional method for fabricating a resin-sealed semiconductor device using existing resin dam bars is described below by referring to the accompanying drawings.

Figure 1A:
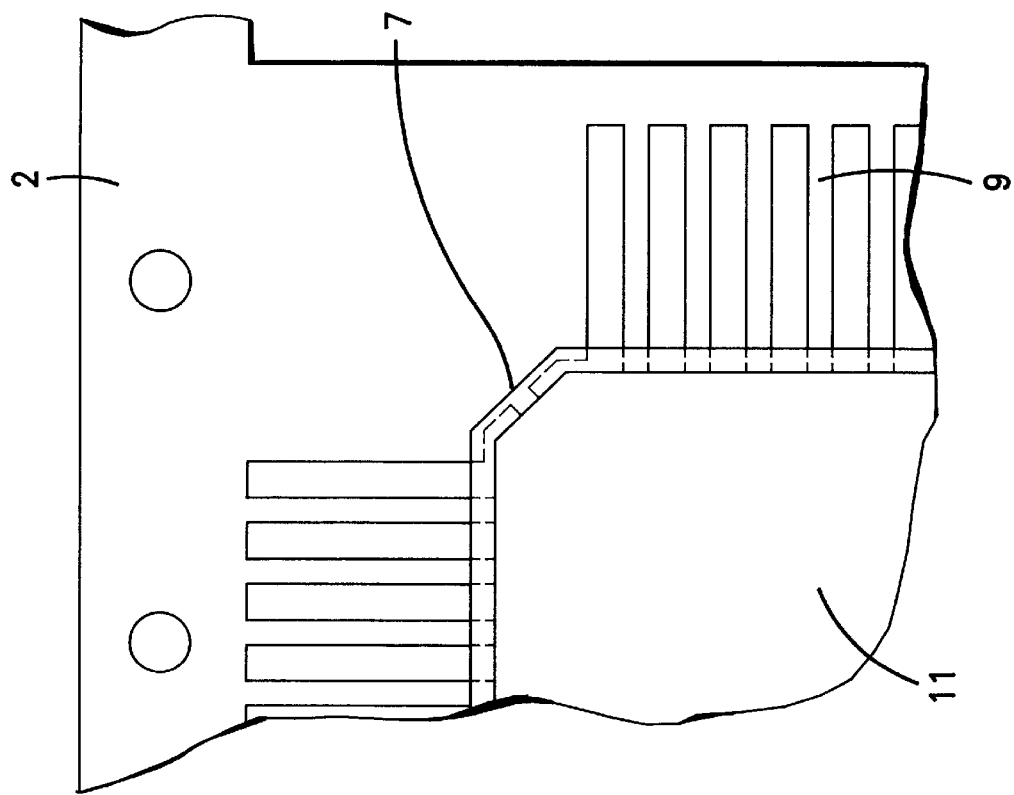
FIGS. 1(a) to 1(c) are partial top views and partial side views of fabrication processes for explaining a prior art.
Figure 1B:
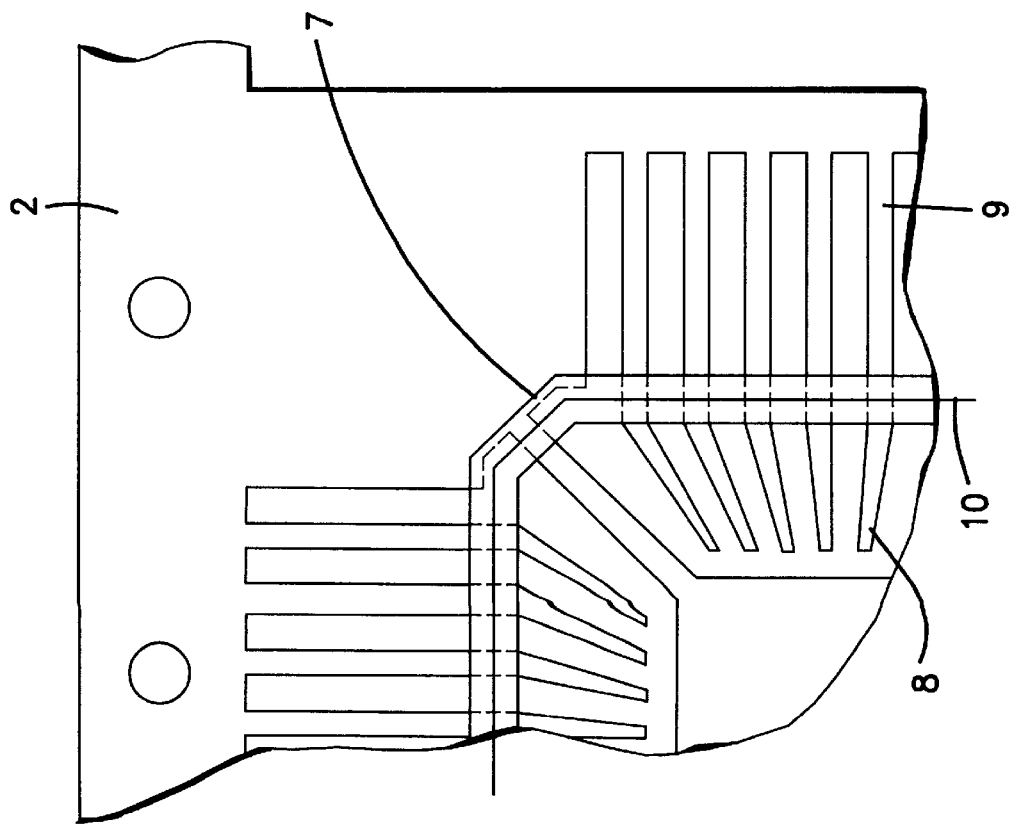
Figure 1C:
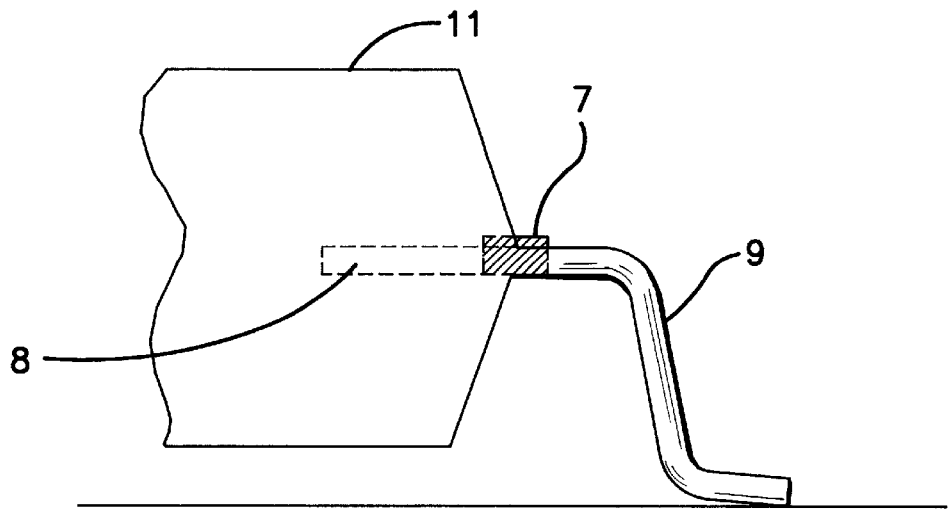

The first existing type is a type of keeping dam bars up to an end product without removing them even after resin sealing. An existing leadframe of the first type is disclosed in the Japanese Laid-Open Patent Nos. Hei 1-241850 and Hei 4-36925. In FIGS. 1(a) to 1(c) showing top views and sectional views of fabrication processes using the first-type leadframe, a liquid insulating material is dropped onto a boundary line between an inner lead 8 and an outer lead 9 formed on a leadframe 2 shown in FIG. 1(a), that is, a mold edge line 10 serving as a mold edge after resin sealing or the vicinity of the line 10 and an insulating-resin dam bar 7 is formed. Thereafter, as shown in FIG. 1(b), the leadframe is sealed with a sealing resin 11 on the mold edge line 10 while holding the insulating-resin dam bar 7. The insulating-resin dam bar 7 uses polyimide-based resin or thermosetting epoxy resin and coating is performed by dropping resin like the dispensing method. After the leadframe is sealed with the resin, it is passed through normal fabrication processes to form the outer lead 9 with the insulating-resin dam bar 7 left on it and formed into an end product.

Figure 2A:
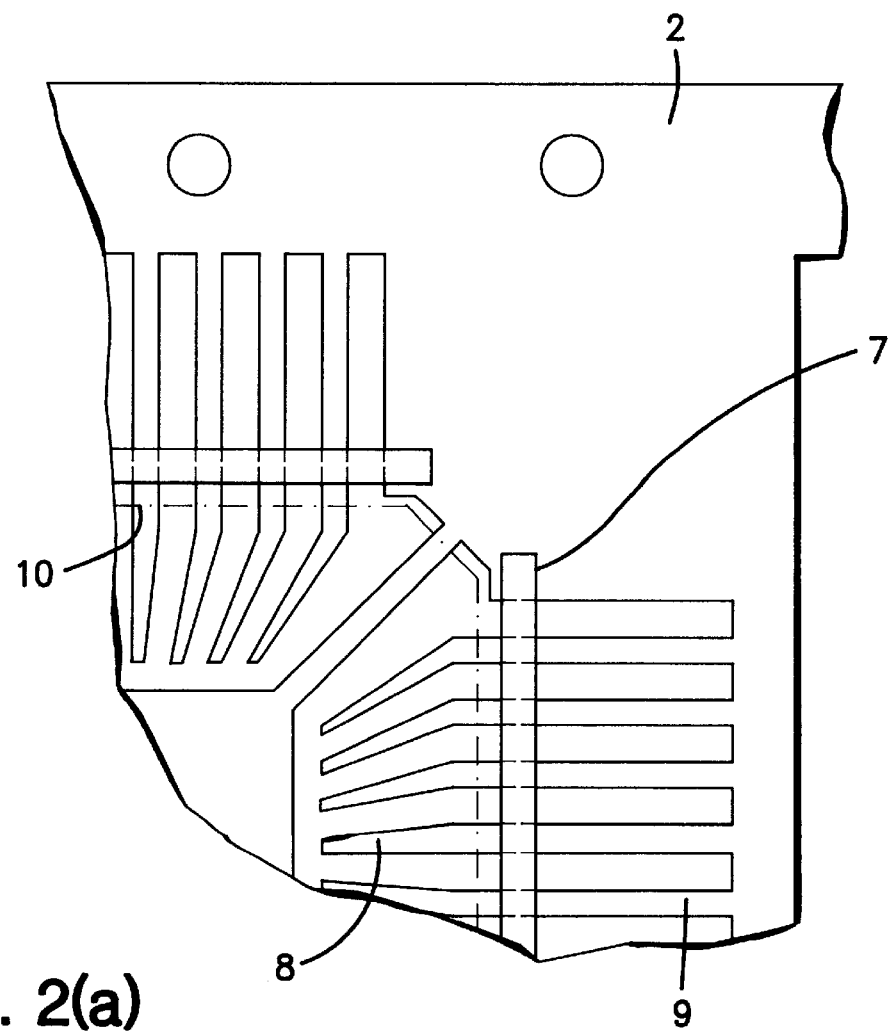
FIGS. 2(a) to 2(c) are partial top views and partial side views of fabrication processes for explaining another prior art.
Figure 2B:
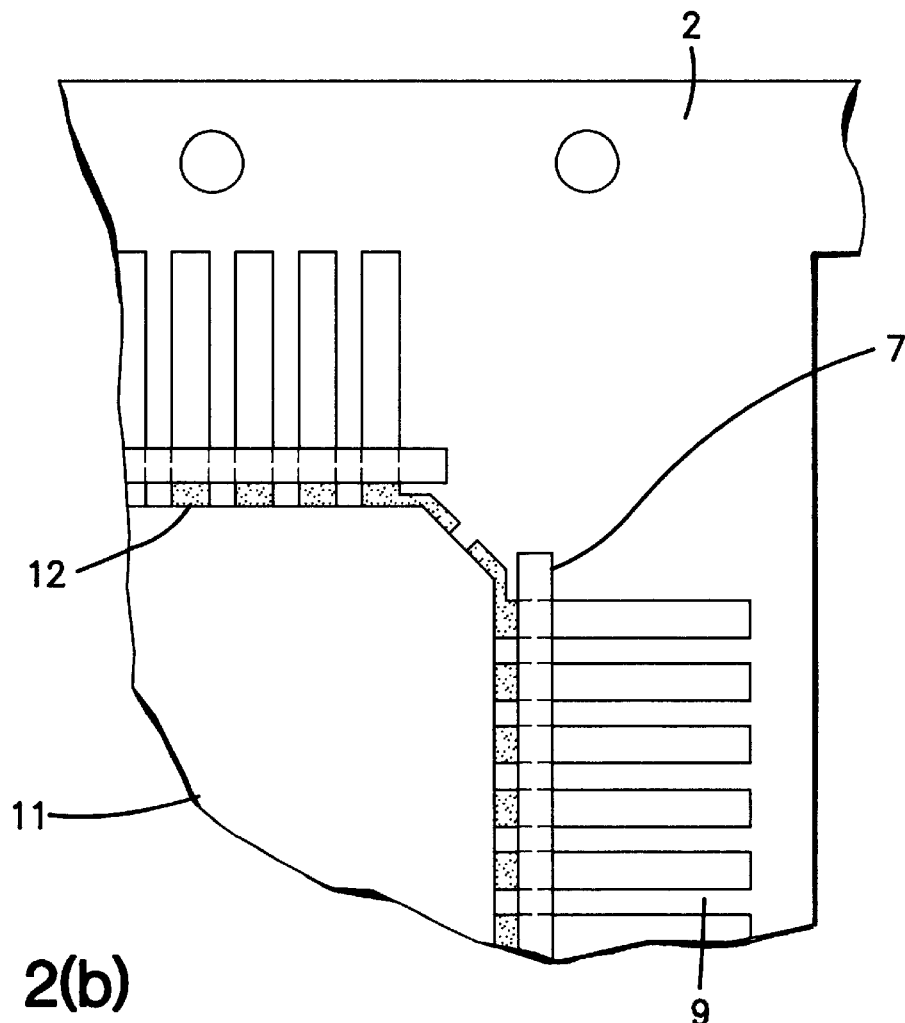
Figure 2C:
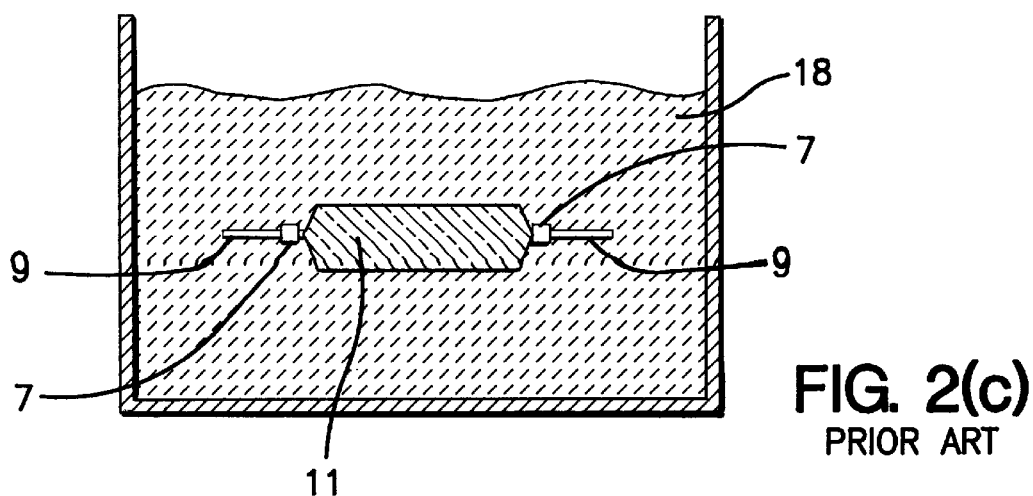

The second existing type is a type of removing insulating-resin dam bars by dissolving them with chemicals such as solvents after resin sealing. The second type is disclosed in the Japanese Laid-Open Patent Nos. Hei 3-248451 and Hei 4-206560. In FIGS. 2(a) to 2(c) showing the fabrication processes using the second-type leadframe, the insulating-resin dam bar 7 is first applied onto the outer lead 9 of the leadframe 2 shown in FIG. 2(a), that is, a position slightly outside of the mold edge line 10 by the dispensing method. Then, as shown in FIG. 2(b), the leadframe is sealed with the sealing resin 11 by using sealing dies. In the case of this type, protruded sealing resin 11, that is, a dam resin 12 is formed between the mold edge line 10 and the insulating-resin dam bar 7 because the insulating-resin dam bar 7 is formed outside of the mold edge line 10 so that it is easily removed later. Therefore, it is general to decrease the distance between the mold edge line 10 and the insulating-resin dam bar 7 in order to decrease the amount of the dam resin 12. After the leadframe is sealed with resin, the insulating-resin dam bar 7 is removed by a solvent 18 for dissolving only the insulating-resin dam bar 7 as shown in FIG. 2(c) and thereafter, passed through normal fabrication processes and formed into an end product. Or, the dam bar is mechanically removed.

To remove unnecessary burrs produced in sealing a semiconductor device or an inner lead with a sealing resin, an art for applying a laser beam to the burrs is disclosed in the Japanese Laid-Open Patent No. Hei 3-106063. Moreover, an art for removing the burrs by soaking them in a resin lubricant and then applying pressure to the lubricant is disclosed in the Japanese Laid-Open Patent No. Hei 1-253927.

Thus, by using insulating-resin dam bars, the existing dam-bar cutting process is disused, problems of durability and abrasion of a dam-bar cutting die are solved, and a resin-sealed semiconductor device is realized which can correspond to fine pitches of 0.4 and 0.3 mm. In the case of the first type of keeping resin dam bars up to an end product, which is one of the resin-sealed semiconductor devices using the existing insulating resin dam bar, however, it is necessary to minimize the amount of the insulating-resin dam bar 7 protruded from the mold edge line 10. If the protruded amount of the insulating-resin dam bar 7 is too much, this causes a trouble in later lead bending because the dam bar 7 is caught by a bent portion of the outer lead 9 when it is formed. Therefore, a problem occurs that a predetermined lead shape or dimension cannot be obtained. Moreover, in the case of this type, because dam bars are kept up to an end product, the material of an insulating-resin dam bar requires a high reliability equivalent to that of a sealing resin. Therefore, the resin cost may increase for development and practical use of the insulating-resin dam bar. In the case of the second type, that is, the type of removing dam bars after resin sealing, chemicals including solvents are used to remove insulating-resin dam bars and these solvents are deleterious substances in general. Therefore, they cause the problem of dangerousness when an operator handles them and the problem of environmental pollution. Moreover, because solvents contact a semiconductor device, the reliability of a sealing resin may be deteriorated. Furthermore, when mechanically removing a dam bar, the airtightness of a sealing resin may be deteriorated. Furthermore, in any case, a trouble such as coating irregularity or thin spot easily occurs because an insulating-resin dam bar is coated by a dropping method such as the dispensing method which is performed by dropping resin onto a lead and moreover, a problem occurs that the coating width of an insulating-resin dam bar easily becomes inaccurate or the positional accuracy of it is easily degraded.

Furthermore, according to the Japanese Laid-Open Patent Nos. Hei 3-106063 and Hei 1-253927, because unnecessary burrs are made of the same material as sealing resin, not only the surfaces of sealing resin and outer lead are damaged but also the adherence force between resin and lead is decreased and the reliability is greatly deteriorated in many cases because a large mechanical stress is applied to the burrs or chemicals with a strong reactivity are used to remove the burrs.

An embodiment of the present invention is described below by referring to the accompanying drawings. In this case, the embodiment is applied to a method for fabricating a quad-flat-package (QFP) resin-sealed semiconductor device. In the case of this embodiment, it is assumed that portions not illustrated in each drawing are constituted symmetrically to the illustrated portions.

Figure 3A:
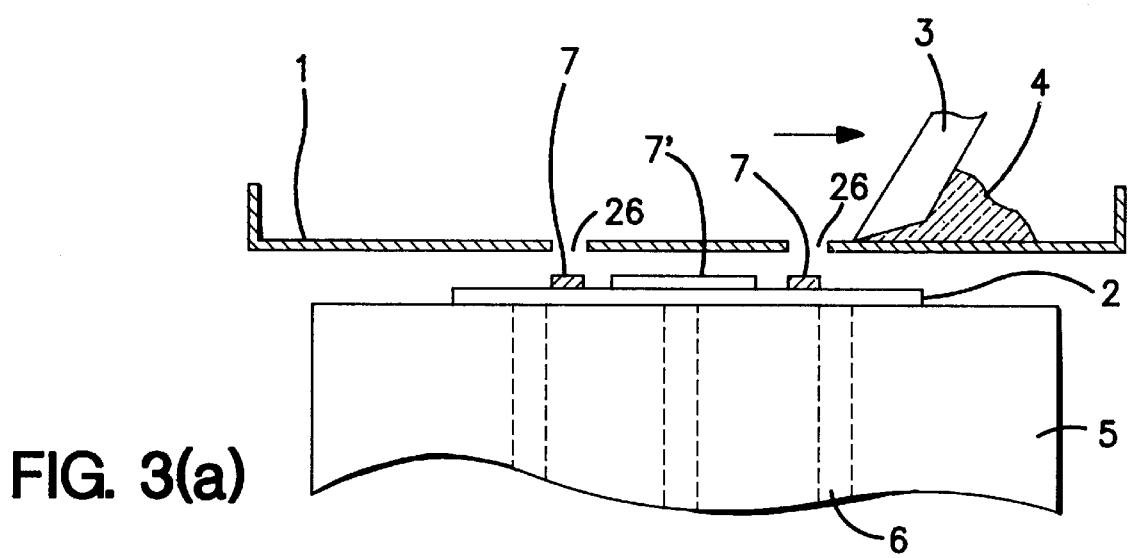
FIG. 3(a) is a partial side view for explaining the resin dam bar forming method of an embodiment of the present invention.

In FIG. 3(a) showing the screen printing method of the embodiment of the present invention, the embodiment uses the screen printing method to print (apply) an insulating resin 4 on (to) the leadframe 2. The screen printing method is characterized in that a high dimensional accuracy can be obtained compared to the dispensing method of applying resin while dropping it. According to the evaluation result by the inventor of the present invention, the screen printing method used by this embodiment shows a high positional accuracy within ±0.1 mm though the dispensing method shows a coating (positional) accuracy of ±0.2 to 0.3 mm. Therefore, the screen printing method greatly contributes to the decrease of the amount of dam resin to be mentioned later.

Figure 3B:
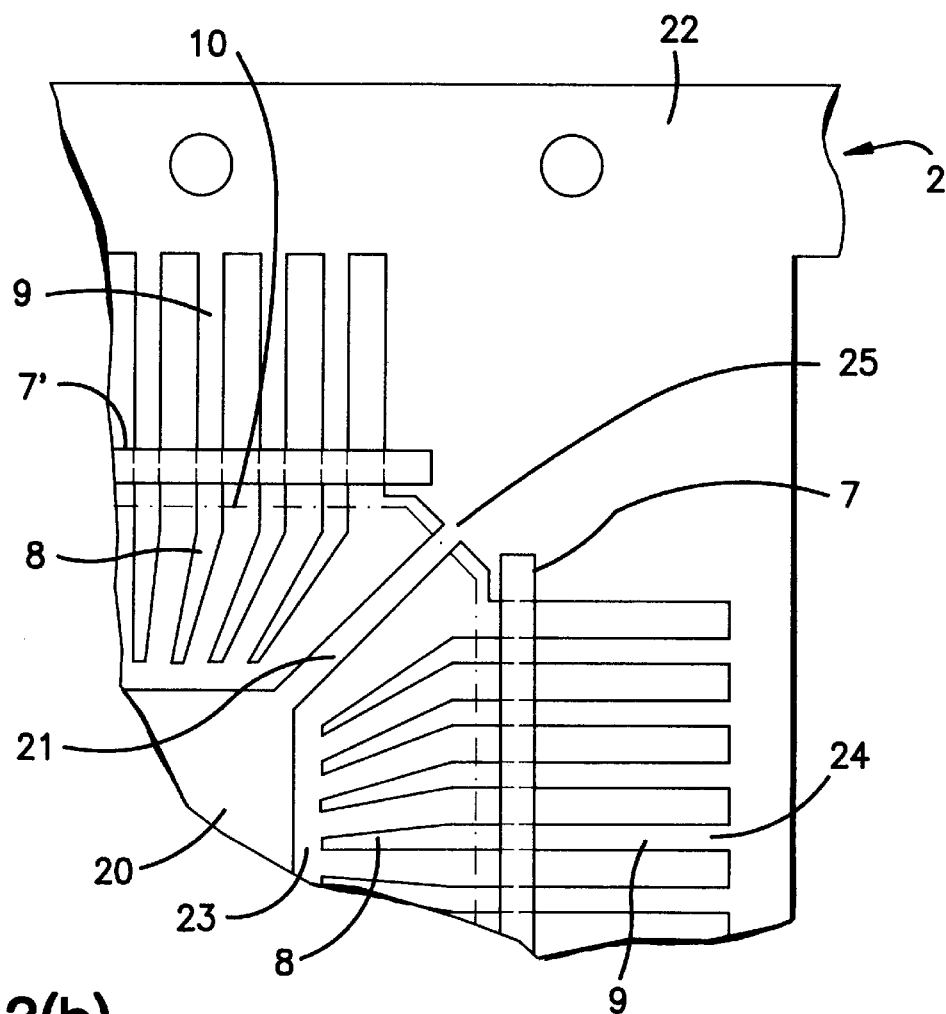
FIG. 3(b) is a partial top view showing a leadframe on which resin dam bars are formed by an embodiment of the present invention.

For this embodiment, a frame member 22 shown in FIG. 3(b) is first prepared which is provided with an opening 23, an island 20 located in the opening 23 to mount a semiconductor device, and a plurality of leads whose inner ends are located in the vicinity of the island 20 and which are respectively extended outward up to an outer end 23 from the vicinity of the island 20 and respectively connected to the frame member 22 at an end 24. The leads of the leadframe 2 are respectively connected to the frame member 22 at the end 24 and mutual positional relation is fixed but they are not connected to each other at portions other than the end 24. Each lead comprises the inner lead 8 inside of a mold edge line 10 and the outer lead 9 outside of the line 10. As shown in FIG. 3(a), the leadframe 2 having the above structure is vacuum-drawn by a drawing hole 6 formed on a stage 5 and fixed. A screen 1 provided with four openings 26 corresponding to a dimensional shape where a resin dam bar should be formed is arranged on the leadframe 2. Under the above state, the liquid insulating resin 4 put on the screen 1 is printed on to the leadframe 2 through each opening 26 of the screen 1 by a squeegee 3. The insulating resin 4 serves as a resin dam bar later. This embodiment uses ultraviolet-curing epoxy resin with a low adhesiveness to the leadframe 2 as the insulating resin. Because the resin dam bar made of it can easily be removed in the subsequent process. In this case, a dam bar 7' is a resin dam bar to be formed at a position perpendicular to the dam bar 7. That is, the dam bars 7 and 7' for respectively connecting a plurality of leads whose tip portions are located in the vicinity of four sides of the island 20 of a QFP-type semiconductor device are printed by one-time movement of the squeegee 3.

Thus, the resin dam bars 7 and 7' are applied as shown by the partial top view in FIG. 3(b). The resin dam bars 7 and 7' are respectively formed so that they connect adjacent leads and are further extended to connect leads with a portion 25 nearby a suspended lead 21 of the frame member 22. The resin dam bar 7 is located at the outer lead 9 nearby the mold edge line 10. The inner lead 8 is almost radially arranged and the outer lead 9 is arranged so as to extend perpendicular to the island 20. Because the insulating-resin dam bars 7 and 7' are later clamped by resin sealing dies, it is necessary to decrease the damage to the outer lead 9.

That is, it is preferable to minimize the thickness of the insulating-resin dam bars 7 and 7' on the outer lead 9. Therefore, in the case of this embodiment, the thickness of the screen 1 is set to 60 μm and it is successful to greatly decrease the coating thickness of the dam bars 7 and 7' after printing up to 10 μm. Theses dam bars are not formed on the suspended lead 21 of the island 20. Moreover, the suspended lead 21 do not greatly move because the island is fixed at four positions.

Then, by using general arts, a semiconductor device is mounted on the island 20 and an electrode pad of the semiconductor device is connected with the inner lead 8 of the lead by a bonding wire. Under the above state, the island 20 and the inner lead 8 of the leadframe 2 are sealed with the sealing resin 11 at the mold edge line 10 in FIG. 3(b) so as to cover the island 20 and the inner lead 8 as shown in FIG. 3(c).

Figure 3C:
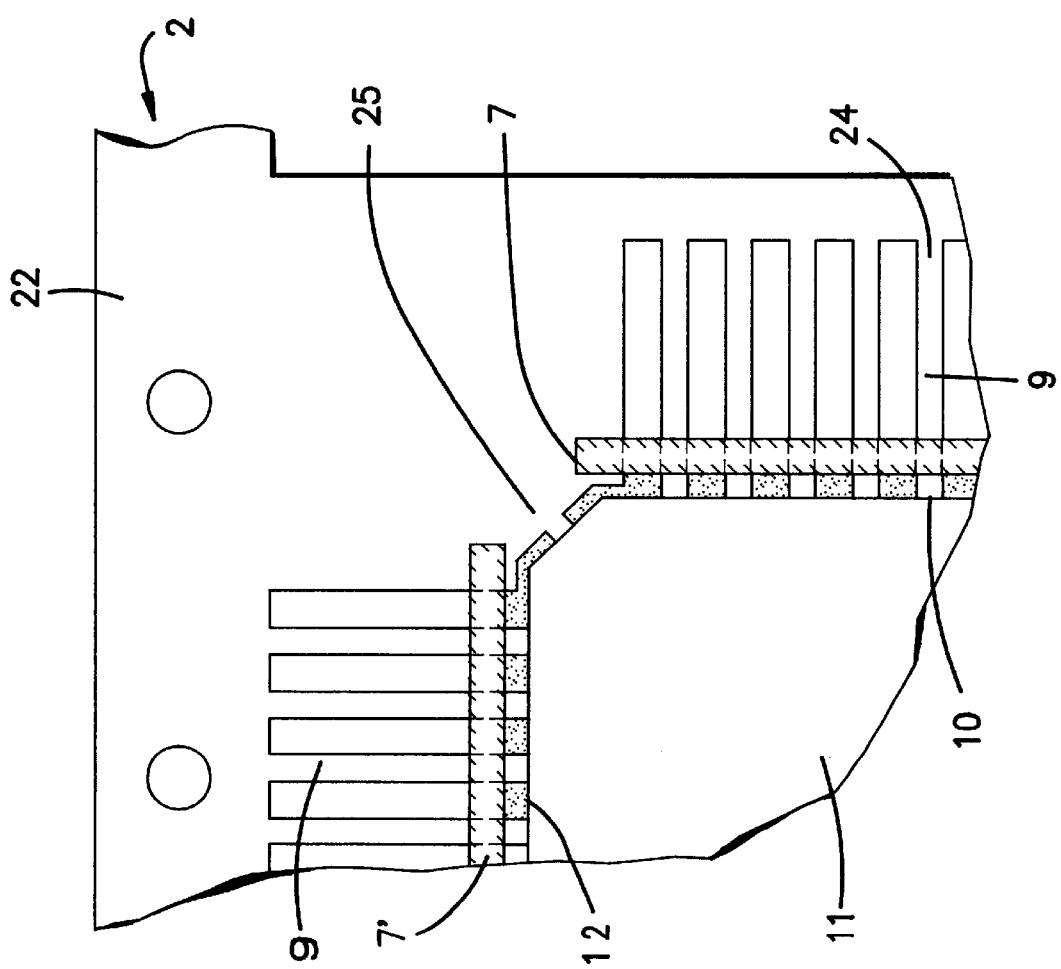
FIG. 3(c) is a partial top view showing a state in which the leadframe shown in FIG. 3(b) is sealed with resin.

In FIG. 3(c), the insulating-resin dam bars 7' and 7 are printed on the outer lead 9 so that they can be removed later. Therefore, the sealing resin 11 protrudes up to the printing position and the dam resin 12 is formed. It is preferable to minimize the amount of the dam resin 12 because, if the resin 12 remains, it may not only damage the appearance of a semiconductor device but also affect the later lead bending. Judging from these points of view, the width of the dam resin 12 must be kept at 0.2 mm or less from the mold edge line 10. Therefore, to decrease the width of the dam resin 12, it is preferable to print the insulating-resin dam bar 7 nearby the sealing resin 11 (mold edge line 10). In the case of this embodiment, the dam bar 7 is set to a position 0.05 mm apart from the mold edge line 10. Even if print deviation occurs, the insulating-resin dam bar 7 is printed at a position 0.15 mm apart from the mold edge line 10 because the screen printing accuracy is kept within ±0.1 mm as described above. Thereby, it is possible to keep the amount of the dam resin 12 in a range between 0.05 to 0.25 mm from the mold edge line 10 at most. Moreover, the width of the insulating-resin dam bar 7 is set to 0.6 mm in accordance with the past experiment results in order to prevent the sealing resin 11 from leaking.

Thus, burrs of the sealing resin 11 or leak of the dam resin 12 is prevented and a semiconductor device in which the outer leads 8 and 9 do not move and leads are accurately arranged is obtained.

Moreover, the frame member 22 for connecting the outer lead 9 is removed by mechanical or chemical etching in the subsequent process.

Figure 4A:
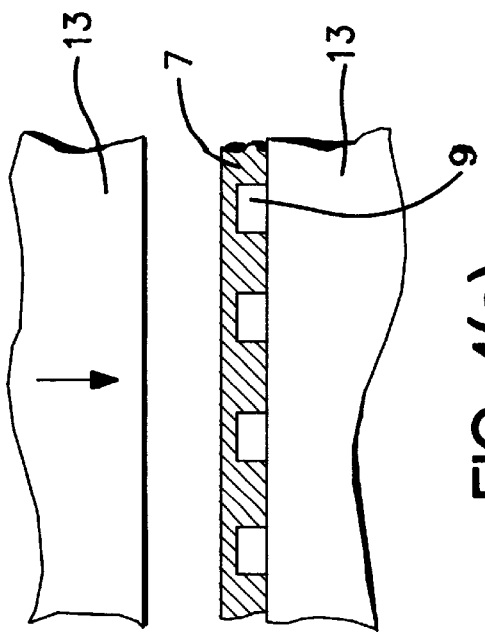
FIGS. 4(a) and 4(b) are partial sectional views showing states before and after pressing dam bars of a leadframe with sealing dies in accordance with the present invention.
Figure 4B:
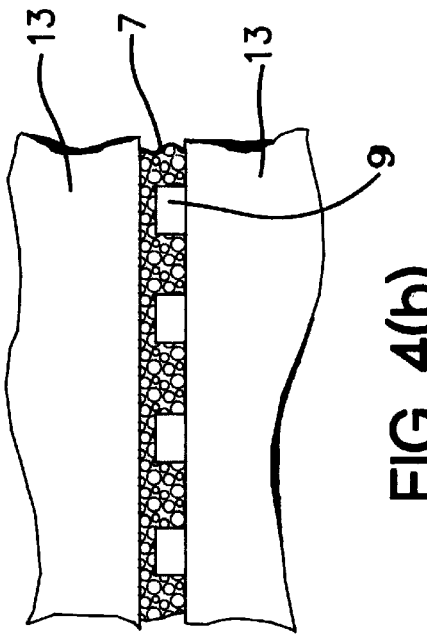

FIGS. 4(a) and 4(b) for explaining methods for removing the dam bars 7 and 7' thus formed are side views showing the first removing method. In FIG. 4(a), it is previously described that the insulating-resin dam bar 7 uses ultraviolet-curing epoxy resin with a low adhesiveness to the leadframe 2 so that the dam bar 7 can easily be removed in the subsequent process. Another reason is that, when the insulating-resin dam bar 7 is clamped by the top and bottom sealing dies 13 for forming the sealing resin 11, the dam bar 7 is crushed to pieces and thereby it is easily removed as shown in FIG. 4(a). FIG. 4(b) shows the insulating-resin dam bar 7 crushed to pieces. The ultraviolet-curing epoxy resin is fragile compared to polyimide-based resin and thermosetting epoxy resin which are used for prior arts. Therefore, when an external force shown in FIG. 4(a) is applied to the dam bar 7, it is easily crushed to pieces. Moreover, the adhesiveness to the leadframe 2 greatly decreases compared to the resin used for prior arts. Therefore, the synergistic effect of them makes it easy to remove the dam bar 7. When the top and bottom dies 13 are separated from each other, the cracked insulating-resin dam bar 7 is easily removed by slight vibrations or slight air blow. It is more preferable to repeatedly use a removing method to be mentioned later.

Figure 5A:
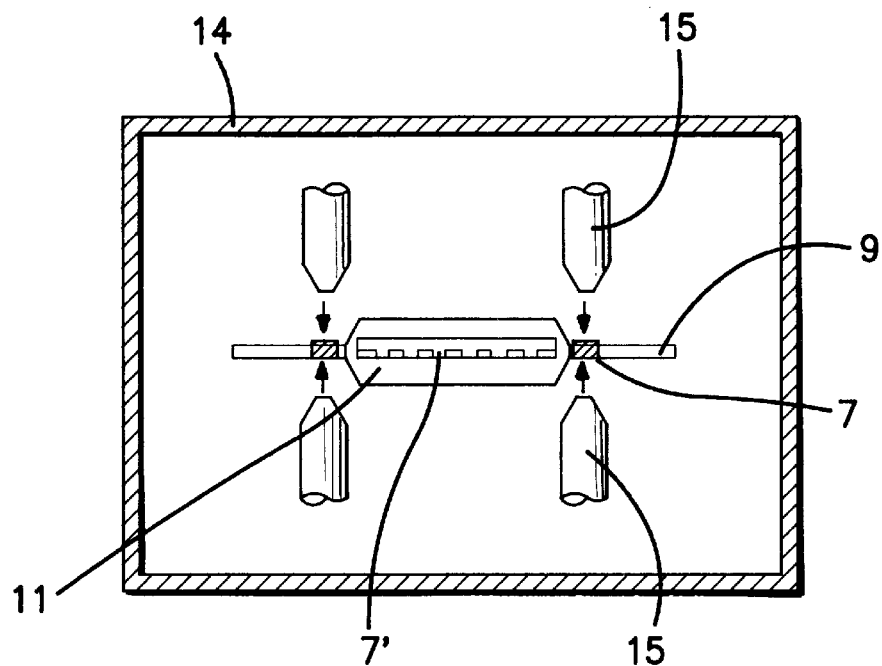
FIGS. 5(a) and 5(b) are side views showing the resin-dam-bar removing method of an embodiment of the present invention.

FIG. 5(a) is a side view showing the second removing method using water-jet honing. In FIG. 5(a), a semiconductor device containing the insulating-resin dam bars 7 and 7' crushed to pieces is set to a water-jet honing apparatus 14 in which the dam bars 7 and 7' are removed by the water jetted from top and bottom nozzles 15. Water is jetted to the surface and back of the outer lead 9. However, the water pressure is kept at 200 kg/cm$^2$ or lower so as to prevent the outer lead 9 from deforming. A resin with a low adhesiveness to a leadframe is used because an insulating-resin dam bar must be removed at the above low water pressure. From experiment results, it is found that a lead is deformed at a water pressure of 300 kg/cm$^2$ or higher. Therefore, this embodiment uses a resin which can be removed at a low water pressure such as ultraviolet-curing epoxy resin with a low adhesiveness to a leadframe.

Figure 5B:
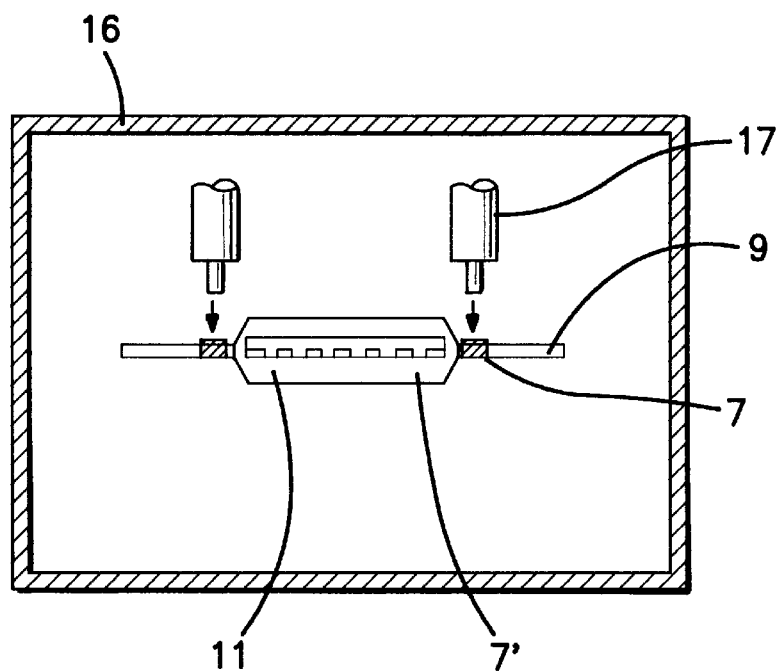

The third removing method is described below by referring to FIG. 5(b). In FIG. 5(b), the third method removes the insulating-resin dam bars 7' and 7 after resin sealing by dissolving them with a laser beam. As shown in FIG. 5(b), a resin-sealed semiconductor device is set to a laser applying apparatus 16 to remove the insulating-resin dam bar 7 with a laser beam emitted from a laser beam source 17 by aiming at the insulating-resin dam bars 7' and 7 from the upside of the outer lead 9. It is enough to use several tens of watts to 100 W as the output of the laser. This embodiment has an advantage that a lead is not deformed because the insulating-resin dam bar 7 can be removed without applying an external force such as a water pressure to the outer lead 9.

Though the above first, second, and third removing methods can be used independently, it is more preferable to combine, for example, the first and the second methods, the first and the third methods, or the first, second, and third methods. That is, a dam bar can be removed without deforming an outer lead by properly using two or more methods at the same time such as mainly applying the third removing method to a portion where the sticking force of the dam bar is large and mainly applying the second removing method to a portion where the sticking force of it is small.

A leadframe in which an outer lead is coated with an electrically insulating material with a low adhesiveness to the leadframe such as ultraviolet-curing epoxy resin as a dam bar of the leadframe is sealed with resin, thereafter the electrically insulating material (insulating-resin dam bar) is removed by wet honing such as water-jet honing or dissolved by a laser beam, and then passed through normal fabrication processes to finish a resin-sealed semiconductor device. The electrically insulating material serving as a dam bar, that is, the insulating-resin dam bar is applied by the screen printing method same as that used for printing solder paste.

As described above, in the case of this embodiment, the dam bars 7 and 7' are fabricated by the screen printing method. Particularly when using the insulating-resin dam bars 7 and 7' made of ultraviolet-curing epoxy resin with a low adhesiveness to a leadframe, the embodiment makes it possible to easily remove the dam bars by means of water-jet honing or laser irradiation. Because the insulating-resin dam bars 7 and 7' are removed after resin sealing, they can be removed without affecting later lead bending or using chemicals such as solvents. Therefore, it is possible to avoid various problems including safety and environmental pollution.

Moreover, because insulating-resin dam bars are removed in the insulating-resin dam bar process unlike the type of keeping insulating-resin dam bars up to an end product, a high reliability of resin is unnecessary and problems of leak and the like do not occur. Thereby, the number of characteristic requested for an insulating-resin dam bar decreases and unnecessary cost is not increased for development. Moreover, this embodiment makes it possible to stably apply insulating-resin dam bar at a high positional accuracy and thereby realize a high-quality resin-sealed semiconductor device fabrication method.

Although the invention has been described with reference to a specific embodiment, this description is not meant to be construed in a limited sense. Various modifications of the disclosed embodiment will become apparent to persons skilled in the art upon reference to the description of the invention. It is therefore intended that the appended claims will cover any modifications or embodiments as fall within the scope of the invention.

What is claimed is:

1. A method for fabricating a semiconductor device, comprising the steps of:

preparing a leadframe having a plurality of leads each of which has an inner portion and an outer portion;

forming a plurality of resin dam bars interconnecting the outer portions, said resin dam bars being deposited through a screen having openings through which a resin material for making the resin dam bars flows;

sealing the inner portions with a molding resin such that the resin dam bars are disposed outside the molding resin; and removing the resin dam bars.

2. The method as recited in claim 1, wherein the resin material is a ultraviolet-curable epoxy resin.

3. The method as recited in claim 2, further comprising the step of:

pressing the resin dam bars with dies used for said sealing step, so as to crack the resin dam bars before said removing step.

4. The method as recited in claim 3, wherein said removing step comprises removing the resin dam bars with a water-jet.

5. The method as recited in claim 3, wherein said removing step comprises removing the resin dam bars with laser irradiation.

* * * * *